United States Patent
Konishi et al.

(10) Patent No.: US 6,491,452 B2
(45) Date of Patent: Dec. 10, 2002

(54) DEVELOPING METHOD AND DEVELOPING APPARATUS

(75) Inventors: Nobuo Konishi, Yamanashi-Ken (JP); Takayuki Toshima, Yamanashi-Ken (JP); Tsutae Omori, Shirane-Machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/832,205

(22) Filed: Apr. 11, 2001

(65) Prior Publication Data

US 2001/0012456 A1 Aug. 9, 2001

Related U.S. Application Data

(62) Division of application No. 09/539,378, filed on Mar. 31, 2000, now Pat. No. 6,238,848.

(30) Foreign Application Priority Data

Apr. 2, 1999 (JP) .............................................. 11-96045

(51) Int. Cl.[7] .................................................. G03D 5/00
(52) U.S. Cl. .......................... 396/611; 118/52; 427/240
(58) Field of Search ................................ 396/604, 611, 396/626, 571; 427/240, 299, 356; 430/327, 329, 330; 118/52, 319–321

(56) References Cited

U.S. PATENT DOCUMENTS

| 4,824,763 A | 4/1989 | Lee .............................. 430/330 |
| 5,252,137 A | 10/1993 | Tateyama et al. .............. 134/34 |
| 5,625,433 A | 4/1997 | Inada et al. .................. 396/604 |
| 5,626,913 A | 5/1997 | Tomoeda et al. ........... 427/299 |

FOREIGN PATENT DOCUMENTS

JP  03-124017 A  5/1991

*Primary Examiner*—Della J Rutledge
(74) *Attorney, Agent, or Firm*—Rader, Fishman & Grauer PLLC

(57) ABSTRACT

When a resist film formed on a substrate is exposed in a predetermined pattern and thereafter an exposed pattern is developed, a substance capable of decreasing fluidity of the developing solution is added to the developing solution, the developing solution to which the substance is added is caused to become low-fluid under a predetermined condition, the developing solution is applied onto the exposed resist film on the substrate, and thereafter a predetermined trigger is given to the developing solution to cause the developing solution to become high-fluid so as to allow developing to progress. Thereby, line width can be made uniform and defects do not tend to occur during coating of the developing solution.

3 Claims, 4 Drawing Sheets

DEVELOPING METHOD AND DEVELOPING APPARATUS

This is a division of application Ser. No. 09/539,378, filed Mar. 31, 2000, now U.S. Pat. No. 6,238,848.

BACKGROUND OF THE INVENTION

1. Field of the Invention

The present invention relates to a developing method and a developing apparatus each for developing an exposed pattern after a resist film formed on a substrate such as a semiconductor wafer, an LCD substrate, or the like is exposed in a predetermined pattern.

2. Description of the Related Art

In a coating and developing system for a photolithography process in processes of semiconductor device fabrication, for example, resist coating processing for forming a resist film on the front surface of a semiconductor wafer and developing processing for developing the wafer after performance of exposure processing for the resist-coated semiconductor wafer are performed.

In the developing processing, the wafer which has undergone exposure in a predetermined pattern, post-exposure bake processing and cooling processing is carried into a developing unit to be mounted on a spin chuck. A developing solution is supplied from a developing solution supply nozzle and applied (heaped up) so as to have a thickness of 1 mm, for example, on the entire surface of the semiconductor wafer, and thus a developing solution puddle is formed. The wafer stands still for a predetermined period of time with the developing solution puddle being formed, and developing processing progresses by natural convection. Thereafter, the developing solution is blown off by the semiconductor wafer being rotated by the spin chuck, and then a rinse solution is discharged from a rinse solution supply nozzle to wash away the developing solution remaining on the wafer. Subsequently, the spin chuck is rotated at a high speed, whereby the developing solution and the rinse solution remaining on the semiconductor wafer are blown away so that the wafer is dried. Thus, a series of developing processing is completed.

When the developing solution puddle is formed in this developing processing, nozzles of various shapes are used for applying the developing solution onto the entire surface of the semiconductor wafer, and the wafer is rotated and the nozzle is scan-moved while the developing solution is being discharged from the nozzle.

In the aforesaid prior developing method, however, the time to heap up the developing solution, impact at the time of supply of the developing solution, displacement speed of the developing solution, and the like are uneven in the surface of the semiconductor wafer by any means when the developing solution puddle is formed on the semiconductor wafer, thereby making it difficult to obtain uniformity of line width. Moreover, defects are prone to occur due to entrance of bubbles in heaping up the liquid and the like.

Recently, with high integration of devices from 64 megabytes to 256 megabytes, it is increasingly demanded to make circuit patterns more minute, and the minimum line width almost reaches a super-submicron region of not more than 0.2 $\mu$m. In order to meet the demand, a chemically amplified resist is used as a resist capable of micromachining, but the chemically amplified resist has poor wettability for the developing solution, so that the aforesaid defects are prone to occur. When micromachining is performed with the chemically amplified resist, the ununiformity of line width due to the aforesaid unevenness becomes remarkable because of quite high sensitivity of the chemically amplified resist for the developing solution.

SUMMARY OF THE INVENTION

An object of the present invention is to provide a developing method and developing apparatus in each of which line width can be made uniform and defects do not tend to occur during coating of the developing solution.

To attain the above object, a first aspect of the present invention is a developing method for developing an exposed pattern after a resist film formed on a substrate is exposed in a predetermined pattern, comprising the steps of: adding a substance capable of decreasing fluidity of a developing solution to the developing solution; causing the developing solution to which the substance is added to become low-fluid under a predetermined condition and applying the developing solution onto the exposed resist film on the substrate; and thereafter giving a predetermined trigger to the developing solution to cause the developing solution to become high-fluid to allow developing to progress.

According to the present invention, the substance capable of decreasing fluidity of the developing solution is added to the developing solution, the developing solution to which the substance is added is caused to become low-fluid under a predetermined condition, and the developing solution is applied onto the exposed resist film on the substrate, whereby developing scarcely progresses at a point of time when the developing solution is applied. The developing solution is caused to become high-fluid after application to allow developing to progress, whereby the developing progresses on the entire substrate all at once. Consequently, time difference in the start time of developing does not occur in the surface of the substrate, thereby enabling uniform developing and improving line width uniformity (CD value uniformity) in the surface of the substrate. Further, since developing progresses all at once after the developing solution is applied and the developing solution is applied in a low-fluid state, the method to heap up the developing solution is not restricted. Furthermore, the developing solution does not directly attack the resist film, thereby decreasing defects.

A second aspect of the present invention is a developing method for developing an exposed pattern after a resist film formed on a substrate is exposed in a predetermined pattern, comprising the steps of: adding a substance changeable from a low-fluid state to a high-fluid state with an increase in temperature to a developing solution; causing the developing solution to which the substance is added to become low-fluid at a predetermined temperature and applying the developing solution onto the exposed resist film on the substrate; and thereafter increasing the temperature of the developing solution to cause the developing solution to become high-fluid to allow developing to progress.

According to the present invention, the substance changeable from a low-fluid state to a high-fluid state with an increase in temperature is added to the developing solution, the developing solution to which the substance is added is caused to become low-fluid at a predetermined temperature, and the developing solution is applied onto the exposed resist film on the substrate, whereby developing scarcely progresses at a point of time when the developing solution is applied. The developing solution is caused to become high-fluid by increasing temperature of the developing solution after application to allow developing to progress, whereby the developing progresses on the entire substrate all at once. Consequently, the same effect as the above can be obtained.

A third aspect of the present invention is a developing apparatus for developing an exposed pattern after a resist film formed on a substrate is exposed in a predetermined pattern, comprising: means for causing a developing solution to which a substance capable of decreasing fluidity of the developing solution is added to become low-fluid under a predetermined condition and applying the developing solution onto the exposed resist film on the substrate; and means for giving a predetermined trigger to the developing solution to cause the developing solution to become high-fluid to allow developing to progress.

A fourth aspect of the present invention is a developing apparatus for developing an exposed pattern after a resist film formed on a substrate is exposed in a predetermined pattern, comprising: means for applying a developing solution to which gelatin is added and which is made a first temperature onto the exposed resist film on the substrate; and means for increasing the temperature of the substrate coated with the resist film from the first temperature to a second temperature which is higher than the first temperature.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
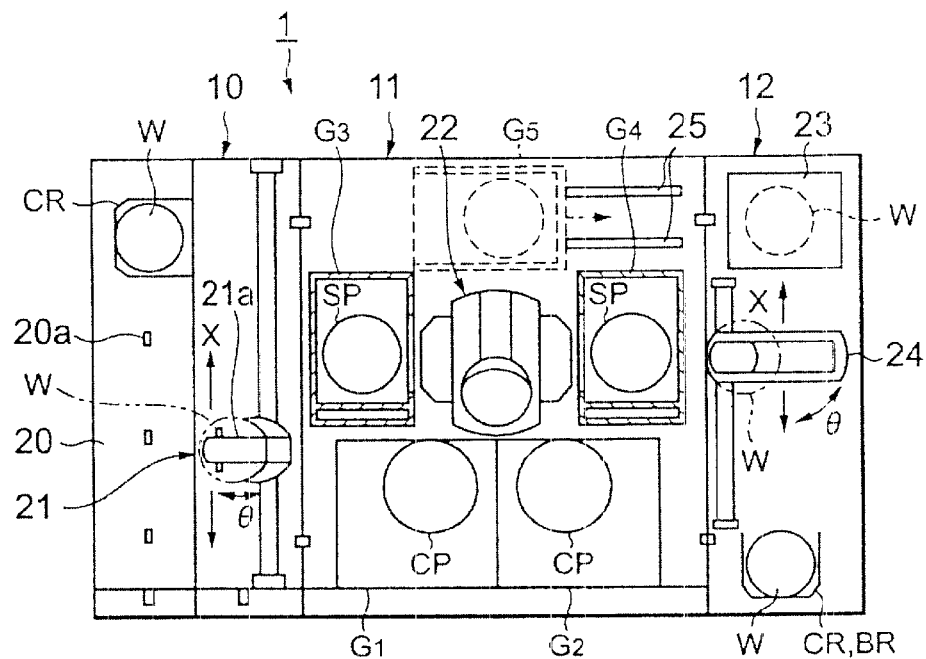
FIG. 1 is a schematic plane view showing a resist coating and developing system according to an embodiment of the present invention.
Figure 2:
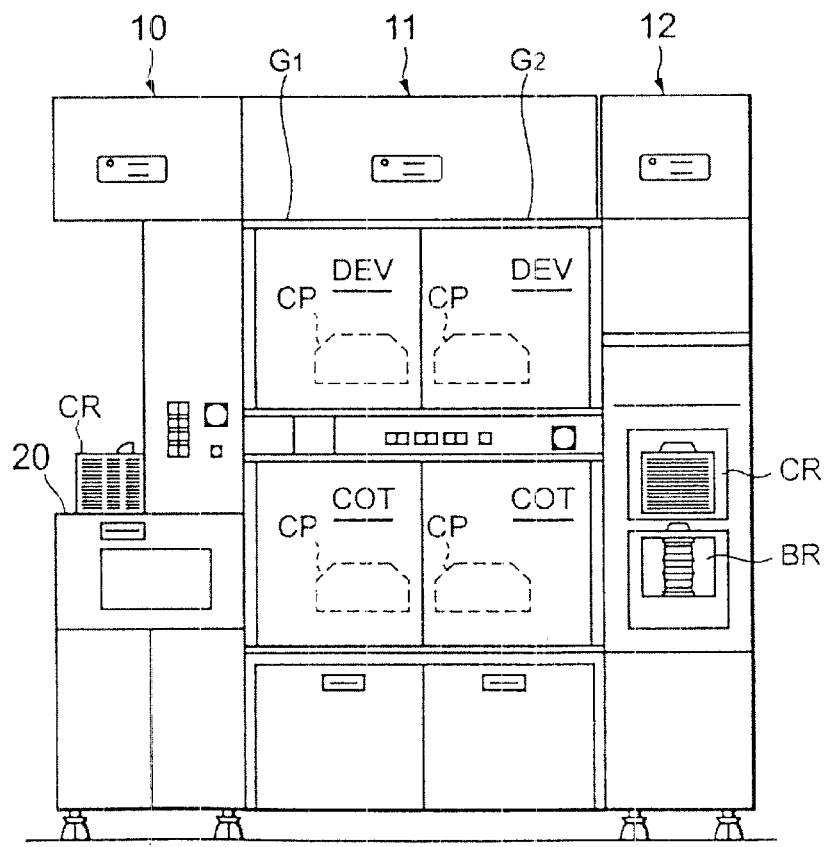
FIG. 2 is a front view showing the resist coating and developing system in FIG. 1.
Figure 3:
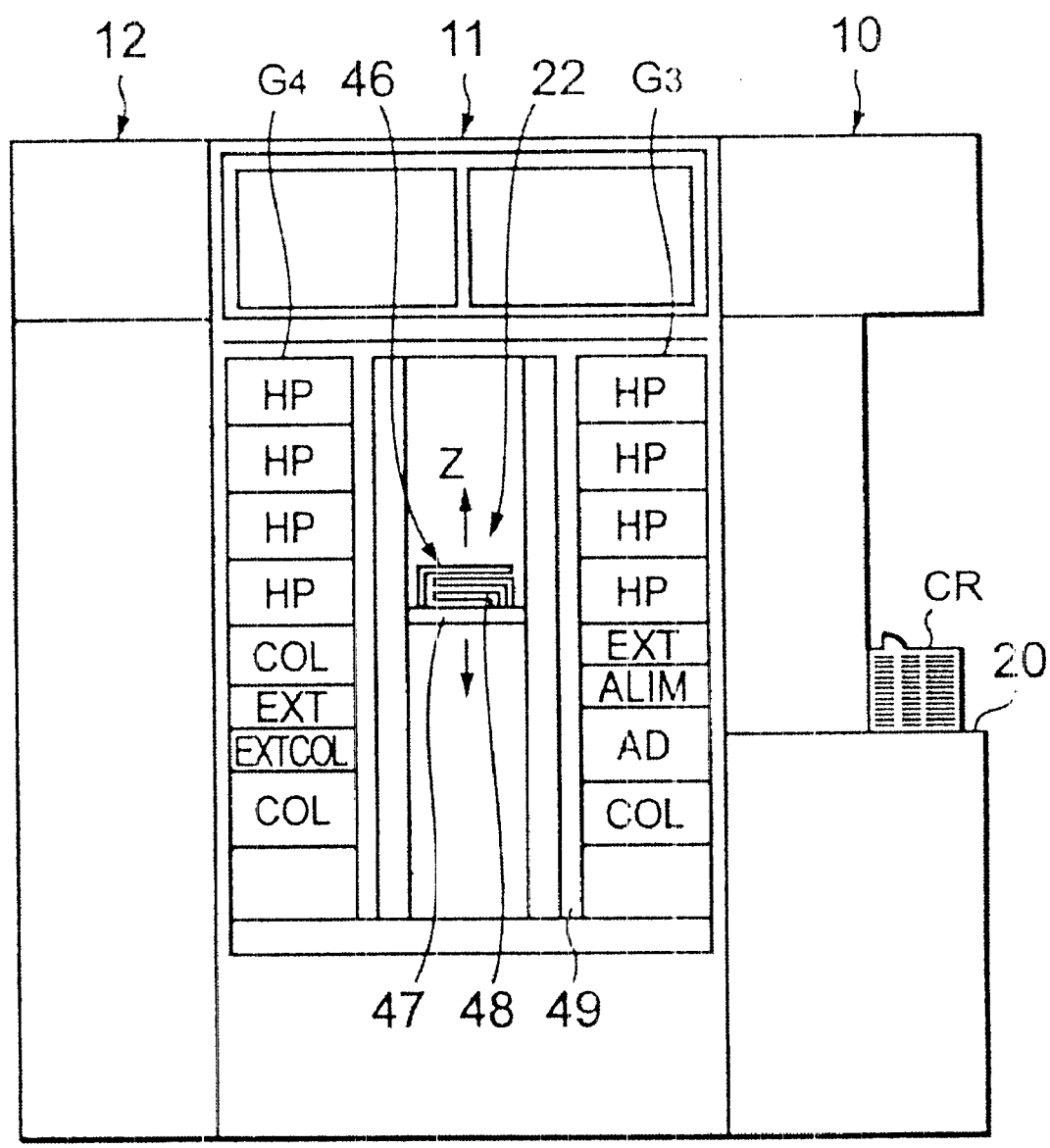
FIG. 3 is a rear view showing the resist coating and developing system in FIG. 1.

As shown in FIG. 1 to FIG. 3, this processing system comprises a cassette station 10 as a transfer station, a processing station 11 having a plurality of processing units, and an interface section 12 for transferring a wafer W to/from an aligner (not shown) provided adjacent to the processing section 11.

The cassette station 10 is provided for carrying a plurality of, for example, 25 semiconductor wafers W (hereinafter referred to only as wafers) as objects to be processed, as a unit, housed in a wafer cassette CR, out of/into another system into/out of this system, and transferring the wafer W between the wafer cassette CR and the processing station 11.

In this cassette station 10, as shown in FIG. 1, a plurality of (four in FIG. 1) positioning projections 20a are formed along an X-direction in FIG. 1 on a cassette mounting table 20, and the wafer cassettes CR can be mounted in a line with respective wafer transfer ports facing the side of the processing station 11 at the positions of the projections 20a. In the wafer cassette CR, the wafers W are arranged in a vertical direction (a Z-direction). The cassette station 10 has a wafer transfer mechanism 21 disposed between the wafer cassette mounting table 20 and the processing station 11. The wafer transfer mechanism 21 has a wafer transfer arm 21a movable in the direction of arrangement of the cassettes (the X-direction) and in the direction of arrangement of the wafers W housed therein (the Z-direction) and can selectively get access to any of the wafer cassettes CR by the transfer arm 21a. The wafer transfer arm 21a is structured to be rotatable in a θ-direction so that it is accessible to an alignment unit (ALIM) and an extension unit (EXT) which are included in a third processing section $G_3$ on the processing station 11 side which will be described later.

The processing station 11 includes a plurality of processing units for carrying out a series of processes when coating and developing processing is performed for the wafer W. The plurality of processing units are multi-tiered at predetermined positions, and the wafers W are processed one by one by these units. As shown in FIG. 1, the processing station 11 has a transfer path 22a in the middle thereof in which a main wafer transfer mechanism 22 is provided, and all the processing units are arranged around the wafer transfer path 22a. The plurality of processing units are divided into a plurality of processing sections, and a plurality of processing units are multi-tiered along the vertical direction in each processing section.

As shown in FIG. 3, the main wafer transfer mechanism 22 includes a wafer transfer device 46 which is ascendable and descendable in the vertical direction (the Z-direction) within a cylindrical supporter 49. The cylindrical supporter 49 can rotate by the rotational driving force of a motor (not shown), and also the wafer transfer device 46 can be integrally rotated with the cylindrical supporter 49.

The wafer transfer device 46 includes a plurality of holding members 48 which are movable in a forward and rearward direction of a transfer base 47. Through the use of the holding members 48, delivery of the wafer W between the processing units is realized.

As shown in FIG. 1, four processing sections $G_1$, $G_2$, $G_3$, and $G_4$ are actually arranged around the wafer transfer path 22a in this embodiment and a processing section $G_5$ can be disposed as required.

Out of these, the first and second processing sections $G_1$ and $G_2$ are arranged in a raw on the front side of the system (on the lower side in FIG. 1), the third processing section $G_3$ is arranged adjacent to the cassette station 10, and the fourth processing section $G_4$ is arranged adjacent to the interface section 12. Moreover, the fifth processing section $G_5$ can be arranged on the rear side.

In the above case, as shown in FIG. 2, in the first processing section $G_1$, two spinner-type processing units in which the wafer W is mounted on a spin chuck (not illustrated) inside a cup CP to undergo predetermined processing are vertically two-tiered. In this embodiment, a resist coating unit (COT) for applying a resist onto the wafer W and a developing unit (DEV) for developing a pattern of the resist are two-tiered from the bottom in order. Similarly in the second processing section $G_2$, a resist coating unit (COT) and a developing unit (DEV) as two spinner-type processing units are two-tiered from the bottom in order.

The reason why the resist coating unit (COT) and the like are disposed on the lower tier side is that drainage of a resist solution is essentially more complex in terms of both mechanism and maintenance than that of a developing solution, and that the complexity is mitigated by disposing the resist coating unit (COT) and the like on the lower tier as described above. It is possible, however, to arrange the resist coating unit (COT) and the like on the upper tier as required.

As shown in FIG. 3, in the third processing section $G_3$, oven-type processing units in each of which the wafer W is placed on a mounting table SP to undergo predetermined processing are multi-tiered. More specifically, a cooling unit (COL) for performing cooling processing, an adhesion unit (AD) for performing so-called hydrophobic processing to enhance fixedness of the resist, an alignment unit (ALIM) for performing alignment, an extension unit (EXT) for carrying the wafer W in and out, and four hot plate units (HP) for performing heat processing for the wafer W before and after exposure processing and after developing processing are eight-tiered from the bottom in order.

In the fourth processing section $G_4$, oven-type processing units are multi-tiered. More specifically, a cooling unit (COL), an extension and cooling unit (EXTCOL) which is a wafer transfer section provided with a cooling plate, an extension unit (EXT), a cooling unit (COL), and four hot plate units (HP) are eight-tiered from the bottom in order.

The above arrangement of the cooling unit (COL) and the extension and cooling unit (EXTCOL) having low processing temperature at the lower tiers and the hot plate units (HP) having high processing temperature at the upper tiers, can reduce thermal mutual interference between units. Random multi-tiered arrangement is naturally suitable.

As described above, the fifth processing section $G_5$ can be provided on the rear side of the main wafer transfer mechanism 22. In the case where the fifth processing section $G_5$ is provided, it can be moved along guide rails 25 laterally as seen from the main wafer transfer mechanism 22. Accordingly, even in the case where the fifth processing section $G_5$ is provided, a space portion is obtained by sliding the fifth processing section $G_5$ along the guide rails 25, so that maintenance operation for the main wafer transfer mechanism 22 can be easily performed from the back thereof. For the operation, a space can be similarly secured not only by moving the fifth processing section $G_5$ linearly, but also by turning it. Incidentally, one processing section having a structure basically the same as the third and fourth processing sections $G_3$ and $G_4$ in which oven-type processing units are multi-tiered can be used as the fifth processing section $G_5$.

The interface section 12 has the same length as the processing station 11 in a depth direction (the X-direction). As shown in FIG. 1 and FIG. 2, a transportable pickup cassette CR and a fixed-type buffer cassette BR are two-tiered at the front of the interface section 12, a peripheral aligner 23 is disposed at the rear, and a wafer transfer body 24 is disposed at the center. The wafer transfer body 24 moves in the X-direction and the Z-direction to be accessible to both the cassettes CR and BR, and the peripheral aligner 23. Moreover, the wafer transfer body 24 is rotatable in the θ-direction to be accessible to the extension unit (EXT) included in the fourth processing section $G_4$ of the processing station 11 and also to a wafer delivery table (not shown) on the adjacent aligner side.

Figure 4:
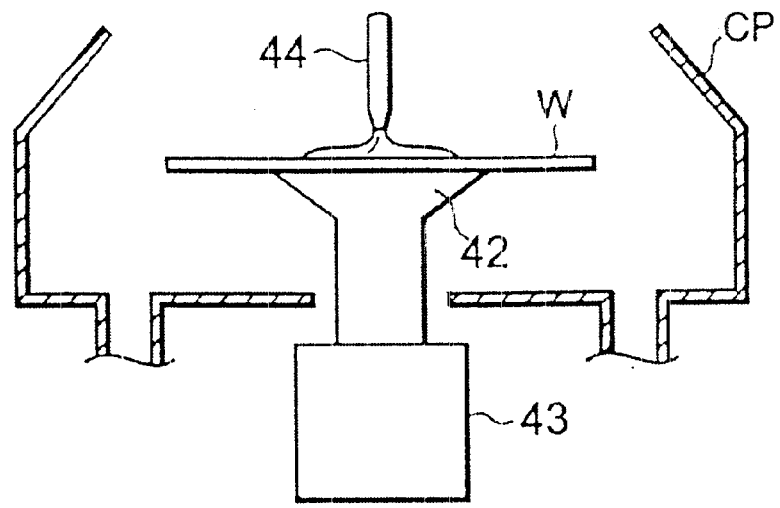
FIG. 4 is a sectional view showing a resist coating unit used in the system in FIG. 1.

As shown in FIG. 4, the resist coating unit (COT) has a cup CP, a spin chuck 42 for suction-holding the wafer W horizontally in the cup CP, a motor 43 for rotating the spin chuck 42, and a nozzle 44 for supplying a coating solution such as a resist solution or the like. The spin chuck 42 and the suction-held wafer W are rotated by the motor 43 while the resist solution is being supplied onto the center of the wafer W from the nozzle 44 to spread the resist solution over the entire surface of the wafer W so as to form a resist film. Alternatively, using a nozzle with a wide width, the resist solution may be applied onto the rotated wafer W by scan-moving the nozzle for supplying the resist solution.

Figure 5:
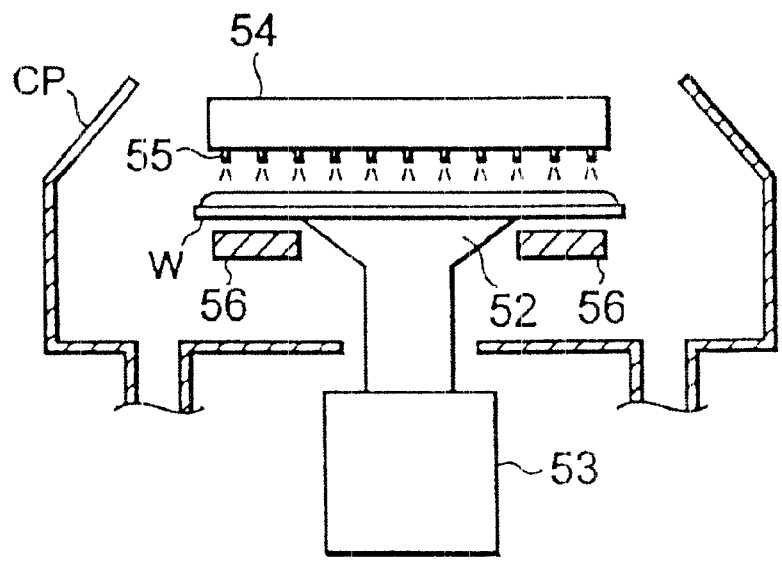
FIG. 5 is a sectional view showing a developing unit used in the system in FIG. 1.

Each developing unit (DEV) has, as shown in FIG. 5, a cup CP, a spin chuck 52 for suction-holding the wafer W horizontally in the cup CP, a motor 53 for rotating the spin chuck 52, and a nozzle 54 for supplying a developing solution. The nozzle 54 has nearly the same width as the wafer W and is provided with a number of developing solution discharge portions 55 over the entire width at the bottom thereof. The spin chuck 52 and the suction-held wafer W are rotated once by the motor 53 while the developing solution is being discharged from the discharge portions 55 of the nozzle 54, thereby forming a developing solution puddle on the wafer W. In this embodiment, as will be described later, a substance, for example, gelatin which is in a low-fluid state at a predetermined temperature, for example, a gel-state or a solid-state, and changes into a high-fluid state owing to an increase in temperature is added to the developing solution and changed into a low-fluid state at the time of the formation of the puddle by adjusting the temperature of the developing solution. At a position below the wafer W, a heating element 56 is provided to increase the temperature of the wafer W after the formation of the puddle so as to cause developing to progress. Moreover, in the developing unit (DEV), a rinse nozzle not shown is provided, so that after the developing solution is blown off by the rotation of the wafer W after the completion of developing, a rinse solution is discharged therefrom to wash away the developing solution remaining on the wafer W. Incidentally, the nozzle 54 may be scan-moved when the developing solution puddle is formed.

Next, a series of processing operations including a developing method of this embodiment will be explained by means of the system structured as above.

In the cassette station 10, the wafer transfer arm 21a of the wafer transfer mechanism 21 first gets access to the cassette CR housing unprocessed wafers W on the cassette mounting table 20 and takes one wafer W out of the cassette CR. The wafer W is transferred to the extension unit (EXT), from which the wafer W is carried into the processing station 11 by means of the transfer device 46 of the main wafer transfer mechanism 22. Then, alignment is performed in the alignment unit (ALIM) included in the third processing section $G_3$ and thereafter hydrophobic processing is performed for the wafer W in the adhesion unit thereunder.

The wafer W for which adhesion processing is completed is cooled in any one of the cooling plate units (COL) of the third and fourth processing sections $G_3$ and $G_4$, and thereafter coated with a resist in a coating unit (COT) of the processing section $G_1$ or $G_2$ in the aforesaid procedures. Thereafter, the wafer W undergoes prebake in any one of the hot plate units (HP) of the processing sections $G_3$ and $G_4$ and cooled in any one of the cooling plate units (COL).

Then, after aligned in the alignment unit (ALIM) of the third processing section $G_3$, the wafer W is transferred to the interface section 12 via the extension unit (EXT) of the fourth processing section $G_4$ by means of the wafer transfer device 46 of the main wafer transfer mechanism 22.

In the interface section 12, peripheral exposure by the peripheral aligner 23 is performed, and then the wafer W is transferred to the adjacent aligner (not shown), where the resist film of the wafer W undergoes exposure processing in accordance with a predetermined pattern.

After the completion of exposure processing, the wafer W is transferred to the extension unit (EXT) included in the fourth processing section $G_4$ by means of the wafer transfer body 24 of the interface section 12, and thence carried into the processing station 11 by the transfer device 46 of the main wafer transfer mechanism 22. The wafer W is transferred to any one of the hot plate units (HP) of the third and fourth processing sections $G_3$ and $G_4$ to undergo post-exposure bake processing and further cooled in any one of the cooling plate units (COL).

The wafer W for which post-exposure bake processing is completed is transferred to any one of the developing units (DEV) of the first and second processing sections G and $G_2$ to be developed.

Figure 6:
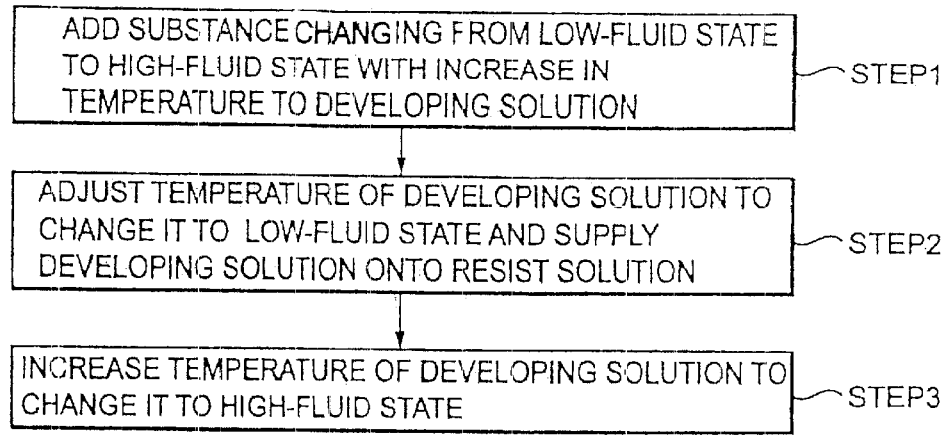
FIG. 6 is a flowchart showing processes of a developing method according to an embodiment of the present invention.

On developing processing, as shown in FIG. 6, a substance, for example, gelatin which is in a low-fluid state, for example, a gel state or a solid state at a predetermined temperature and changes into a high-fluid state with an increase in temperature, is added to the developing solution (STEP 1). The temperature of the developing solution is adjusted so that the developing solution to which such a substance is added becomes a low-fluid state, for instance, having about 60 poise, and the developing solution is supplied onto the resist film formed on the wafer W (STEP 2). In the developing solution in the low-fluid state as described above, a chemical reaction between the developing solution and the resist scarcely occurs, and thus developing does not actually progress. For instance, when 10 g to 12 g of gelatin is added to 100 cc of the developing solution, the developing solution decreases in fluidity at 13° C. and comes into a state in which it does not actually flow at 8° C., and consequently, developing does not progress in both states.

At the point of time when the developing solution has spread over the entire surface of the wafer W, the heating element 56 heats the wafer W to increase the temperature of the developing solution so as to change the developing solution to a high-fluid state (STEP 3). In the above example of gelatin, the developing solution immediately has become high-fluid by increasing the temperature to 13° C. or more. The developing solution becomes a high-fluid state as above, whereby developing progresses in the entire surface of the wafer W all at once. Hence, time difference in the start time of developing does not occur in the surface of the wafer W, thereby enabling uniform developing and an improvement in line width uniformity (CD value uniformity) in the surface of the wafer. Moreover, since developing progresses all at once after the developing solution is applied and the developing solution is applied in the low-fluid state, the method to heap up the developing solution is not restricted. Accordingly, a simpler nozzle can be used in place of the aforesaid nozzle 54 and it is also possible to apply the developing solution by means except for a nozzle. Furthermore, the developing solution does not directly attack a resist film 51, thereby reducing defects.

After developing processing is completed as described above, the wafer W undergoes postbake in any one of the hot plate units (HP) and then it is cooled in any one of the cooling units (COL). Thereafter, the wafer W is placed on the mounting table of the extension unit (EXT) by means of the transfer device 46 of the main wafer transfer mechanism 22 of the processing station 11. The wafer W on the mounting table is then received by the arm 21a of the wafer transfer mechanism 21 of the cassette station 10 and inserted in a predetermined wafer housing slot of a cassette CR for housing processed wafers on the cassette mounting table 20. Thereby, a series of processing is completed.

It should be noted that the present invention is not limited to the aforesaid embodiment, and various modifications are possible. For instance, since developing progresses all at once and the time to heap up the developing solution is not restricted as described above, the developing solution nozzle is not limited to one according to the aforesaid embodiment, nozzles of any type, for example, straight-type, slit-type, and the like can be used. Moreover, since the developing solution is low-fluid during coating, it is not always necessary to use a nozzle, and it is also possible to use another means such as a roll coater or the like. Further, when the developing solution is quite low in fluidity, it may be put on the wafer without means.

Figure 7A:
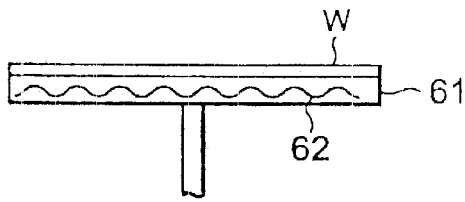
FIG. 7A, FIG. 7B, and FIG. 7C are schematic views each showing another example of a heating method of a developing solution.
Figure 7B:
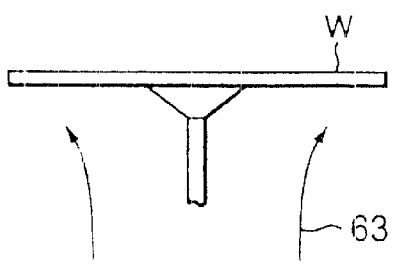
Figure 7C:
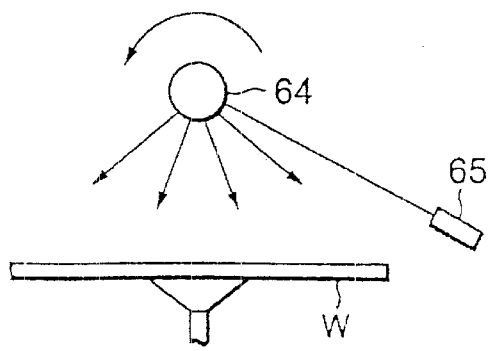

Although the heating element is provided below the wafer to heat the developing solution in the aforesaid embodiment, not limited to the above, it is also preferable that, for instance, a heater 62 is embedded in a wafer support table 61 for heating as in FIG. 7A. Moreover, as shown in FIG. 7B, it is also possible that hot air 63 is supplied from below the wafer W. Not limited to heating from below, it is also preferable that a polygon mirror 64 rotatable in the direction indicated by the arrow is disposed above the wafer W, and ultraviolet light, laser light, or a microwave is irradiated to the polygon mirror 64 from an emitter 65 while the polygon mirror 64 being rotated, thereby irradiating scattered laser light or the like to the wafer W to heat it. From the viewpoint of direct heating of a portion where developing occurs, it is more preferable to heat the wafer from below. Moreover, instead of provision of a heating means as above, the developing solution may be caused to become high-fluid only by the heat which the wafer possesses.

Further, in the aforesaid embodiment, a substance which changes in fluidity depending on the temperature is added to the developing solution, thereby changing the developing solution from a low-fluid state to a high-fluid state with temperature as a trigger. Not limited to this, a substance which changes from a low-fluid state to a high-fluid state by irradiation of light may be added.

Furthermore, a substrate is not limited to a semiconductor wafer, but the present invention can be applied to various substrates such as an LCD substrate, a glass substrate, a CD substrate, a photo mask, and a printed board.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A developing apparatus for developing an exposed pattern after a resist film formed on a substrate is exposed in a predetermined pattern, comprising:

means for applying a developing solution, to which a substance capable of decreasing fluidity of the developing solution is added, onto the exposed resist film on a substrate after causing the developing solution to become low-fluid under a predetermined condition; and means for giving a predetermined trigger to the developing solution to cause the developing solution to become high-fluid to allow developing to progress.

2. A developing apparatus for developing an exposed pattern after a resist film formed on a substrate is exposed on a predetermined pattern, comprising:

means for supplying a developing solution to which gelatin capable of decreasing fluidity of the developing solution is added and which is made a first temperature onto the exposed resist film on the substrate, the developing solution having a low fluidity at the first temperature; and means for increasing the temperature of the substrate coated with the resist film from the first temperature to a second temperature which is higher than the first temperature, the developing solution having a high fluidity at the second temperature.

3. The method as set forth in claim 2, wherein the first temperature is approximately 8° C. and the second temperature is 13° C. or more.

* * * * *